United States Patent [19]
Dydyk et al.

[11] Patent Number: 5,175,517
[45] Date of Patent: Dec. 29, 1992

[54] LUMPED ELEMENT REALIZATION OF RING HYBRIDS INCLUDING π CIRCUIT AND TANK CIRCUIT MEANS

[75] Inventors: Michael Dydyk, Scottsdale; Ronald F. Keilmeyer, Jr., Chandler; John K. Lauchner, Tempe, all of Ariz.

[73] Assignee: Motorola, Inc., Schaumburg, Ill.

[21] Appl. No.: 726,718

[22] Filed: Jul. 1, 1991

Related U.S. Application Data

[63] Continuation of Ser. No. 474,901, Feb. 5, 1990, abandoned.

[51] Int. Cl.⁵ .............................. H01P 5/22
[52] U.S. Cl. ...................... 333/118; 333/120
[58] Field of Search .......... 333/118, 120, 117, 112, 333/124, 100

[56] References Cited

U.S. PATENT DOCUMENTS

| | | | |
|---|---|---|---|
| 3,484,724 | 12/1969 | Podell | 333/112 |
| 3,781,718 | 12/1973 | Gittinger | 333/118 |
| 4,556,856 | 1/1985 | Presser | 333/124 |
| 4,893,098 | 1/1990 | Seely et al. | 333/118 X |

FOREIGN PATENT DOCUMENTS

| | | | |
|---|---|---|---|
| 68917 | 4/1982 | Japan | 333/100 |
| 43412 | 2/1988 | Japan | 333/117 |

OTHER PUBLICATIONS

Parisi, Samuel J., "A Lumped element Rat Race coupler"; *Applied Microwaves;* Aug./Sep. 1989; pp. 84-93.
Putnam, J. and Puente R. "A monolithic image-rejection mixer on GaAs using lumped elements"; *Microwave Journal;* Nov. 1987; pp. 107-116.

*Primary Examiner*—Paul M. Dzierzynski
*Assistant Examiner*—Benny Lee
*Attorney, Agent, or Firm*—Jeffrey D. Nehr; Jordan C. Powell

[57] ABSTRACT

A broad-band lumped element ring hybrid is comprised of a π equivalent of a transmission line which is coupled to an electric ground through either a plurality of capacitors or plurality of inductors. The plurality of capacitors which are coupled to ground are coupled together with an inductor, while the plurality of inductors which are coupled to ground are coupled together with a capacitor. A plurality of tank circuits are coupled to the π equivalent to broaden the bandwidth of the ring hybrid. Each tank circuit comprises an inductor and a capacitor.

4 Claims, 4 Drawing Sheets

SERIES ELEMENT

SHUNT ELEMENT

LENGTH OF TRANSMISSION LINE

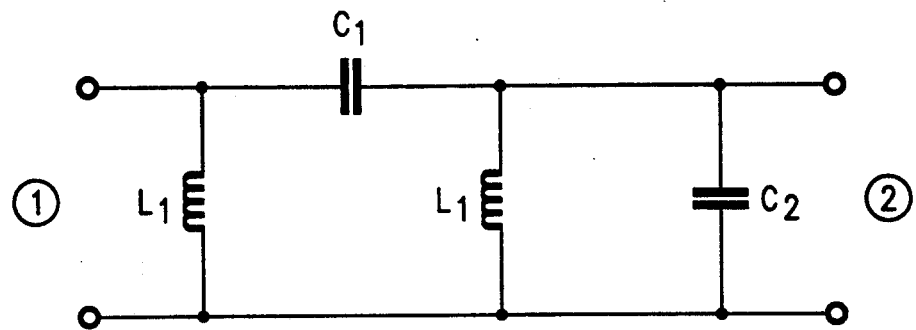
*FIG. 7*
*FIG. 8*
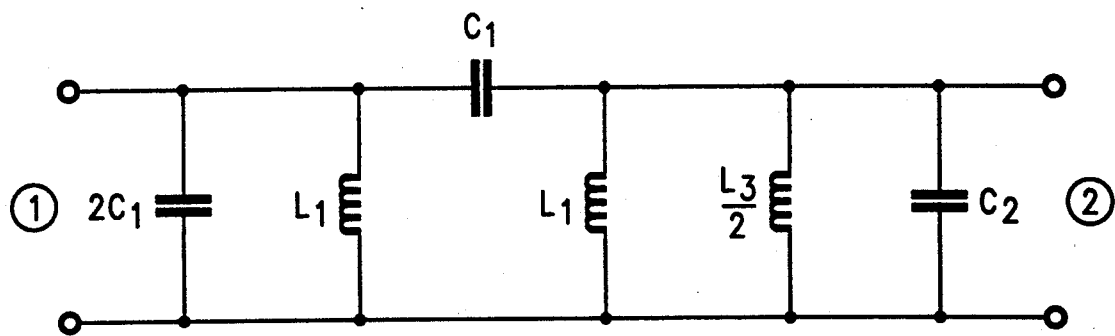

LUMPED ELEMENT REALIZATION OF RING HYBRIDS INCLUDING π CIRCUIT AND TANK CIRCUIT MEANS

CROSS REFERENCE TO RELATED APPLICATION

This application is a continuation of application Ser. No. 474,901 filed Feb. 5, 1990, now abandoned.

BACKGROUND OF THE INVENTION

This invention relates, in general, to hybrids, and more specifically, to microwave ring hybrids.

Ring hybrids have been widely used in radio and microwave communications for two or three decades. Ring hybrids are also used in mobile and cellular radios, and satellite communication systems.

Ring hybrids, or directional couplers, were originally constructed using transmission lines. The transmission lines of the ring hybrids extend in a circle and have a number of terminal branches projecting from the circular wave path at given intervals. The electrical lengths of the transmission lines are determined and arranged such that power will be present at certain of the terminals with given phase differentials. Power at the other terminals will be zero since the phase differential between signals at the zero terminals will cancel. Ring hybrids incorporating transmission lines supply broad frequency bandwidths. A ring hybrid demonstrating these characteristics is described in U.S. Pat. No. 3,229,233, Variable Power Division Hybrid Ring Directional Coupler issued Jan. 11, 1966 to Chuck Y. Pon and assigned to Textron Inc.

With the advent of MMIC (monolithic microwave integrated circuit) technology, space restrictions were imposed on circuitry. Transmission lines were incompatible with MMIC circuits and chips. A basic need is to incorporate as much of the circuitry on a single small chip as possible. As size decreases, particularly with hybrids such as ring hybrid, the bandwidth diminishes.

SUMMARY OF THE INVENTION

Accordingly, it is an object of the present invention to provide a physically small in size, yet broadband, ring hybrid.

A broad-band lumped element ring hybrid is comprised of a π equivalent of a transmission line which is coupled to an electric ground through either a plurality of capacitors or plurality of inductors. The plurality of capacitors coupled to ground are coupled together with an inductor, while the plurality of inductors coupled to ground are coupled together with a capacitor. A plurality of tank circuits are coupled to the π equivalent to broaden the bandwidth of the ring hybrid. Each tank circuit comprises an inductor and a capacitor.

The above and other objects, features, and advantages of the present invention will be better understood from the following detailed description taken in conjunction with the accompanying drawings.

BRIEF DESCRIPTION OF THE DRAWING

FIG. 7 is an even mode circuit of a symmetrical portion of the embodiment of FIG. 6.

FIG. 8 is an odd mode circuit of a symmetrical portion of the embodiment of FIG. 6.

DETAILED DESCRIPTION OF THE INVENTION

Figure 1:
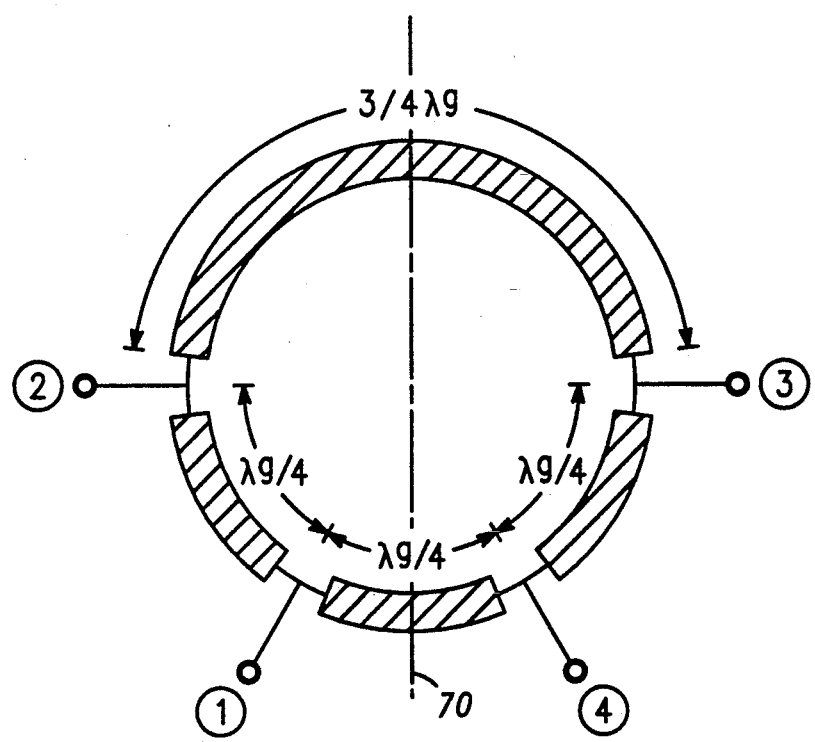
FIG. 1 is a representation of a conventional ring hybrid.

A conventional ring hybrid is shown in FIG. 1. The hybrid of FIG. 1 consists of terminals 1,2,3, and 4. Terminals 2 and 3 are separated by a three-quarter wave length transmission line, while terminals 1 and 2; 1 and 4; and 3 and 4 are each one-quarter wave-length apart. The total length of the ring hybrid is one and one-half wave-length. The characteristic impedence of the hybrid is $\sqrt{2Z_o}$ where $Z_o$ is the characteristic impedance of the hybrid. To incorporate the ring hybrid within MMIC circuitry, lumped elements must be used to decrease the size of the hybrid.

Figure 2:
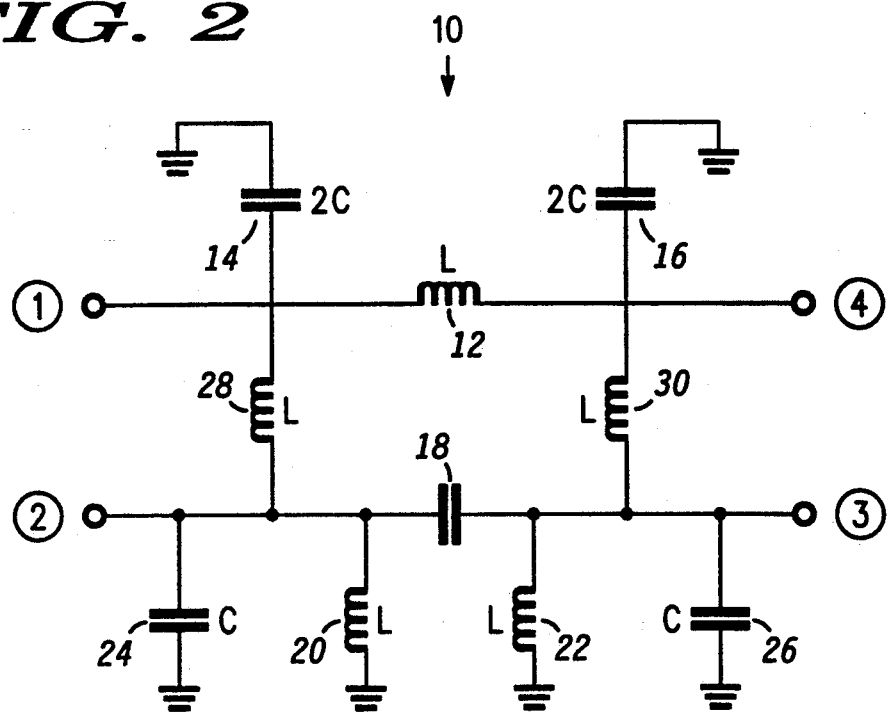
FIG. 2 is a schematic of a lumped element ring hybrid according to the present invention.

A broadband, lumped element configuration of ring hybrid 10 is shown in a first embodiment in FIG. 2. To achieve broad bandwidth, hybrid 10 is derived mathematically from broad bandwidth ring hybrids utilizing transmission lines. The general concept is to replace the transmission lines with the lumped element equivalents. A lumped element hybrid, ring hybrid 10, is developed using an ABCD matrix.

Figure 3:
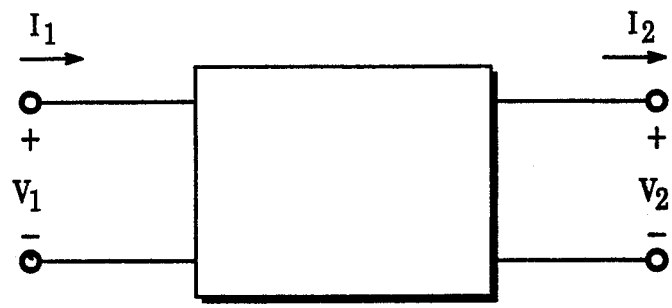
FIG. 3 is a schematic of a simple 2-port network.
Figure 4A:
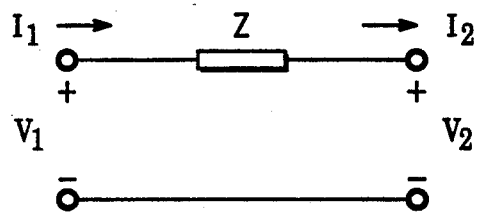
FIGS. 4A, 4B, 4C are a series of schematics representing the configurations for series and shunt elements, and transmission lines for use with ABCD matrixes.

The basic ABCD matrixes used to develop hybrid 10 is derived from the input to output voltages and currents of the network of FIG. 3. FIG. 3 depicts the general A,B,C,D matrix characterization and is applied separately to the series elements having an impedance Z, the shunt elements having a reactance of Y, length of transmission line 1, and impedance of $Z_o$ in FIGS. 4A, 4B, and 4C. The ABCD matrix description is $$\begin{bmatrix} V_1 \\ I_1 \end{bmatrix} = \begin{bmatrix} A & B \\ C & D \end{bmatrix} \begin{bmatrix} V_2 \\ I_2 \end{bmatrix}. \quad (1)$$

where $I_1$ is the input current, $V_1$ is the input voltage, $I_2$ is the output current, and $V_2$ is the output voltage as shown in FIG. 4A.

Figure 4B:
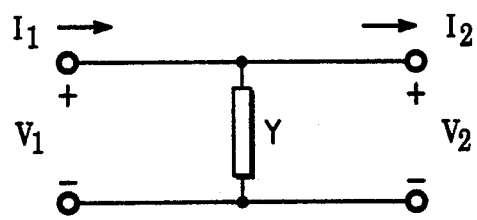
Figure 4C:
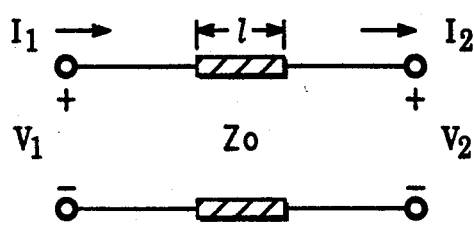

The various ABCD matrices for the network elements for hybrid 10 are shown in FIGS. 4A, 4B, and 4C. The ABCD portion of the matrix for the series elements having an impedence Z is represented by FIG. 4a and is defined as $$\begin{bmatrix} A & B \\ C & D \end{bmatrix} = \begin{bmatrix} 1 & Z \\ 0 & 1 \end{bmatrix}. \quad (2)$$

The ABCD portion of the matrix for the shunt elements having a reactance of Y is represented by FIG. 4b and defined as $$\begin{bmatrix} A & B \\ C & D \end{bmatrix} = \begin{bmatrix} 1 & 0 \\ Y_1 & 1 \end{bmatrix}. \quad (3)$$

Finally, the ABCD matrix relating to lengths of transmission lines having lengths l and an impedance of $Z_o$ is represented by FIG. 4c and defined as $$\begin{bmatrix} A & B \\ C & D \end{bmatrix} = \begin{bmatrix} \cos\theta & jZ_o\sin\theta \\ jY_o\sin\theta & \cos\theta \end{bmatrix}. \quad (4)$$

where $$\theta = \frac{2\pi}{\lambda_g}(l) = \frac{2\omega}{v}(l)\sqrt{\epsilon_{eff}} = \frac{2\omega}{v}\sqrt{\epsilon_{eff}}(l), \quad (5)$$

with v as the velocity of light, $Y_o$ as the characteristic admittance, $\lambda_g$ as the operating wavelength, and $\epsilon_{eff}$ as the effective dielectric constant and $\omega$ is the frequency.

Equivalence is established by equating each ABCD matrix element of the transmission line and its $\pi$ representation. Equivalence is frequency dependent and must be performed at the desired operating frequency.

Figure 5:
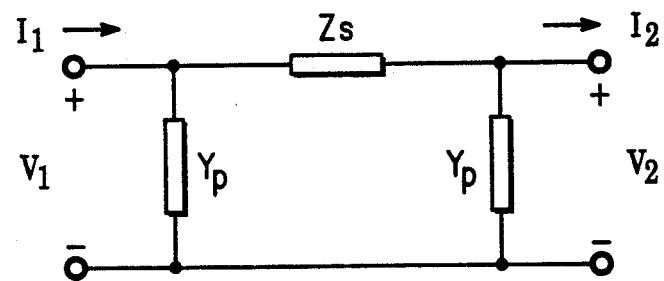
FIG. 5 is a transmission line π equivalent schematic of FIG. 4.

Ring hybrids have quarter-wave length and three quarter-wave length transmission lines. The ABCD matrixes for these two lengths are $$\begin{bmatrix} A & B \\ C & D \end{bmatrix} = \begin{bmatrix} 0 & jZ \\ jY & 0 \end{bmatrix} \quad (6)$$

for the quarter-wave length, and $$\begin{bmatrix} A & B \\ C & D \end{bmatrix} = \begin{bmatrix} 0 & -jZ \\ -jY & 0 \end{bmatrix} \quad (7)$$

for the three quarter-wave length lines. FIG. 5 depicts the schematic for the transmission line $\pi$ equivalent of FIGS. 4A, 4B, and 4C. The composite ABCD matrix for the $\pi$ representation in FIG. 5 is $$\begin{bmatrix} A & B \\ C & D \end{bmatrix} = \begin{bmatrix} 1 + Z_sY_p & Z_s \\ Y_p(2 + Z_sY_p) & 1 + Z_sY_p \end{bmatrix}. \quad (8)$$

$Z_s$ is the series impedance and $Y_p$ is the shunt reactance.

Equating the elements of equations 7 and 8 yields $$1 + Z_sY_p = 0 \quad (9)$$

$$Z_s = j\sqrt{2} Z_o \quad (10)$$

and $$Y_p(2 + Z_sY_p) = j\frac{Y_o}{\sqrt{2}} \quad (11)$$

where $Y_o$ is the characteristic reactance of the hybrid and $$Z = \sqrt{2} Z_o. \quad (12)$$

Scrutiny of equation 10 shows that the series element is an inductor having a value of $$L = \frac{\sqrt{2} Z_o}{\omega_o} \quad (13)$$

where $\omega_o$ is the operating frequency.

The shunt element is determined by evaluating equation 11. The shunt element is capacitive and has a value of $$Y_p = -\frac{1}{Z_s} = j\omega C \quad (14)$$

where $\omega$ is the frequency and $$C = \frac{Y_o}{\sqrt{2} \omega_o}. \quad (15)$$

Performing the same operations with equations 7 and 8 shows that the series element must be capacitive and the shunt element must be inductive. The values of the elements are given in equations 13 and 15, respectively.

Referring again to FIG. 2, the result of the ABCD matrix analysis is shown. Specifically, hybrid 10 comprises terminals 1,2,3, and 4 which correspond to the terminals of the conventional hybrid of FIG. 1. An inductor 12 having a value L is coupled between terminals 1 and 4, and is capacitively coupled to ground on either side by capacitors 14 and 16. Capacitors 14 and 16 each have a value of 2C. Capacitor 18 having a value of C is coupled between terminals 2 and 3. Capacitor 18 is inductively coupled to ground on either side by inductors 20 and 22 having values of L, and capacitively coupled to ground on either side by capacitors 24 and 26. Capacitors 24 and 26 have values of C. Terminals 1 and 2, and terminals 3 and 4 are coupled together by inductors 28 and 30 respectively. Inductors 28 and 30 have values of L. One skilled in the art will recognize that capacitors 24 and 26, and inductors 20 and 22 represent what are known as tank circuits. Tank circuits are utilized to increase the bandwidth of hybrid 10.

Figure 6:
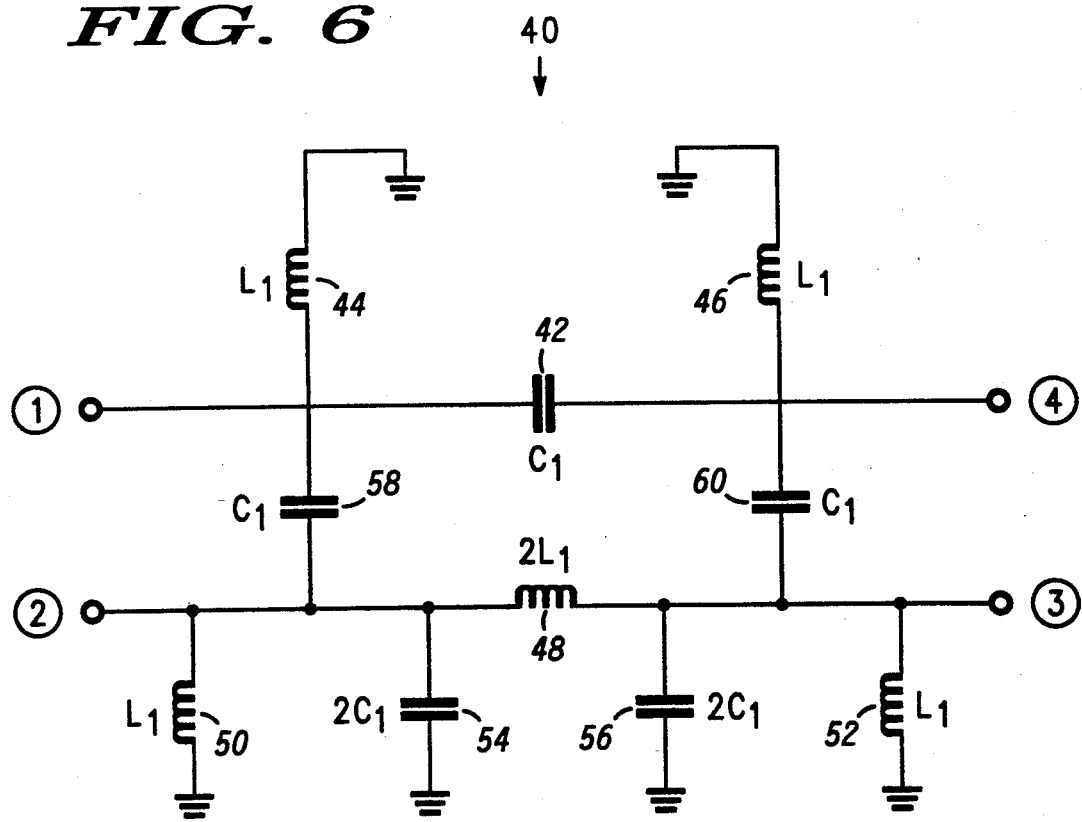
FIG. 6 is a schematic of a second, and preferred, embodiment of the present invention.

A second, and preferred, embodiment, or dual realization of the present invention is shown in FIG. 6 as hybrid 40. This embodiment is also derived from the conventional ring hybrid of FIG. 1. As seen in FIG. 1, the ring hybrid has a line of symmetry 70. Using symmetry in the analysis, the following can be shown:

$$S_{11} = \tfrac{1}{2}(\Gamma_e + \Gamma_o) \quad (16)$$

$$S_{14} = \tfrac{1}{2}(\Gamma_e - \Gamma_o) \quad (17)$$

$$S_{12} = \tfrac{1}{2}(T_e + T_o) \quad (18)$$

$$S_{13} = \tfrac{1}{2}(T_e - T_o) \quad (19)$$

where $\Gamma_e$ is the even reflection coefficient, $\Gamma_o$ is the odd reflection coefficient, $T_e$ is the even transmission coefficient and $T_o$ is the odd transmission coefficient.
where $S_{11}$, $S_{12}$, $S_{13}$, and $S_{14}$ are the four overall scattering parameters of the ring hybrid.

Furthermore, $$S_{11} = 0 \quad (20)$$

$$S_{14} = S_{12} = \pm j \frac{1}{\sqrt{2}} \quad (21)$$

$$S_{13} = 0 \quad (22)$$

The even and odd mode reflection coefficients are related to the ABCD matrix through $$\Gamma = \frac{A + \frac{B}{Z_o} - CZ_o - D}{A + \frac{B}{Z_o} + CZ_o + D} \quad (23)$$

where $\Gamma$ is the resultant reflection coefficient.

$$T = \frac{2}{A + \frac{B}{Z_o} + CZ_o + D} \quad (24)$$

where T is the resultant transmission coefficient.

From equations 16 through 19, and 20 through 24, the following is determined:

$$\Gamma_e = -T_o = \pm j \frac{1}{\sqrt{2}} \quad (25)$$

$$T_e = T_o = \pm j \frac{1}{\sqrt{2}} \quad (26)$$

$$\Gamma_e = T_e \quad (27)$$
and
$$T_o = -\Gamma_o. \quad (28)$$

Then for the even mode case, the parameters A, B, C, and D become $A_e$, $B_e$, $C_e$, and $D_e$; similarly, for the odd mode case A, B, C, and D become $A_o$, $B_o$, $C_o$, and $D_o$, and:

$$A_e = D_e + \frac{B_e}{Z_o} - C_oZ_o = 2 \quad (29)$$

and $$A_o = D_o + \frac{B_o}{Z_o} - C_oZ_o = -2. \quad (30)$$

Also for $T_e$ equal to the transmission coefficient for the even mode case and for $T_o$ equal to the transmission coefficient for the odd mode case:

$$T_e = \frac{2}{A_e + \frac{B_e}{Z_o} + C_eZ_o + D_e} = \pm j \frac{1}{\sqrt{2}} \quad (31)$$

$$T_o = \frac{2}{A_o + \frac{B_o}{Z_o} + C_oZ_o + D_o} = \pm j \frac{1}{\sqrt{2}}. \quad (32)$$

Accordingly, $$T_o = A_e + \frac{B_e}{Z_o} + C_eZ_o + D_e = \pm j2 \frac{1}{\sqrt{2}} \quad (33a)$$

and $$T_o = A_o + \frac{B_o}{Z_o} + C_oZ_o + D_o = \pm j2 \frac{1}{\sqrt{2}} \quad (33b)$$

Recognizing that for lossless networks A and D are purely real and B and C are imaginary, $$A_e - D_e = 2 \quad (34)$$
$$A_O - D_O = -2 \quad (35)$$

$$\frac{B_e}{Z_o} - C_eZ_o = 0 \quad (36)$$

$$\frac{B_o}{Z_o} - C_oZ_o = 0 \quad (37)$$

$$A_e + D_e = 0 \quad (38)$$
$$A_O + D_O = 0 \quad (39)$$

$$\frac{B_e}{Z_o} + C_eZ_o = \pm j2 \sqrt{2} \quad (40)$$

and $$\frac{B_o}{Z_o} + C_oZ_o = \pm j2 \sqrt{2}. \quad (41)$$

The ABCD matrices for even and odd mode, respectively are determined from equations 22 through 35 as:

$$\begin{bmatrix} A & B \\ C & D \end{bmatrix}_e = \begin{bmatrix} 1 & \pm j\sqrt{2}\, Z_o \\ \pm j\sqrt{2}\, Y_o & -1 \end{bmatrix} \quad (42)$$

and $$\begin{bmatrix} A & B \\ C & D \end{bmatrix}_o = \begin{bmatrix} -1 & \pm j\sqrt{2}\, Z_o \\ \pm j\sqrt{2}\, Y_o & 1 \end{bmatrix}. \quad (43)$$

where $[ABCD]_e$ is the even mode ABCD analysis matrix and $[ABCD]_0$ is the odd mode ABCD analysis matrix.

Matrices 36 and 37 can be used to determine whether or not a particular circuit topography will function as a ring hybrid. Assuming the circuit architecture of FIG. 6, and using symmetry, hybrid 40 may be broken into the even and odd mode equivalents shown in FIGS. 7 and 8 respectively. The two inductors labelled $L_1$ and the capacitor labelled $C_2$ are connected in a series/parallel configuration with capacitor $C_1$ as shown in FIG. 7 to constitute the even mode equivalent circuit of FIG. 6. Similarly, in FIG. 8, the three inductors shown with inductances labelled $L_1$, $L_1$, and $L_3/2$ and the capacitors shown with capacitances labelled $2C_1$, $C_1$, and $C_2$ are connected in a series/parallel configuration to form the odd mode equivalent circuit of FIG. 6.

Using the $\pi$ equivalent matrix of Equation 8 for $L_1$ equal to the inductance of each of the inductors shown and for $C_1$, $C_2$, and $2C_1$ equal to the respective capacitances of the capacitors shown in FIGS. 7 and 8, yields $$\begin{bmatrix} AB \\ CD \end{bmatrix}_e = \begin{bmatrix} 1 + \frac{1}{\omega C_1}\left(\omega C_2 - \frac{1}{\omega L_1}\right) & \frac{-j}{\omega C_1} \\ \frac{-j}{\omega L_1} + j\left(\omega C_2 - \frac{1}{\omega L_1}\right)\left(1 - \frac{1}{\omega^2 L_1 C_1}\right) & 1 - \frac{1}{\omega^2 L_1 C_1} \end{bmatrix} \quad (44)$$

$$\begin{bmatrix} AB \\ CD \end{bmatrix}_o = \tag{45}$$

$$\begin{bmatrix} 1 + \frac{1}{\omega C_1}\left(\omega C_2 - \frac{1}{\omega L_1} - \frac{2}{\omega L_3}\right) & \frac{-j}{\omega C_1} \\ j\left(2\omega C_1 - \frac{1}{\omega L_1}\right) + & \\ j\left(\omega C_2 - \frac{1}{\omega L_1} - \frac{2}{\omega L_3}\right)* & 1 - \frac{1}{\omega C_1}\left(2\omega C_1 - \frac{1}{\omega L_1}\right) \\ \left(1 + (2\omega C_1 - \frac{1}{\omega L_1})\frac{1}{\omega C_1}\right) & \end{bmatrix}$$

$[ABCD]_e$ is the even mode ABCD analysis matrix and $[ABCD]_0$ is the odd mode ABCD analysis matrix.

Equating equations 42 and 44 gives $$1 + \frac{1}{\omega C_1}\left(\omega C_2 - \frac{1}{\omega L_1}\right) = 1 \tag{46}$$

$$\frac{1}{\omega C_1} = \sqrt{2}\, Z_o. \tag{47}$$

and $$1 - \frac{1}{\omega^2 L_1 C_1} = -1. \tag{48}$$

This yields $$\omega C_2 = \frac{1}{\omega L_1} \tag{49}$$

$$\omega_o^2 L_1 C_1 = \frac{1}{2} \tag{50}$$

$$\omega_o L_1 = \frac{Z_o}{\sqrt{2}} \tag{51}$$

and $$\omega_o C_2 = \sqrt{2}\, Y_o. \tag{53}$$

The final element to determine is $L_3$. $L_3$ is determined by equating equations 43 and 45 to yield $$1 + \frac{1}{\omega C_1}\left[\omega C_2 - \frac{1}{\omega L_1} - \frac{2}{\omega L_3}\right] = -1. \tag{54}$$

This gives $$\omega_o L_3 = \frac{1}{\omega_o C_1} = \sqrt{2}\, Z_o. \tag{55}$$

Dual lumped element hybrid 40 of FIG. 6 is comprised of terminals 1, 2, 3, and 4. Terminals 1 and 4 are capacitively coupled by capacitor 42 having a value of $C_1$. Capacitor 42 is inductively coupled to ground on either side by inductors 44 and 46 having values of $L_1$. Terminals 2 and 3 are inductively coupled by inductor 48 having a value of $2L_1$. Inductor 48 is coupled to ground on either side by inductors 50 and 52, and capacitors 54 and 56. Inductors 50 and 52 have values of $L_1$, and capacitors 54 and 56 have values of $2C_1$. Terminals 1 and 2, and terminals 3 and 4 are capacitively coupled by capacitors 58 and 60, respectively, having values of $C_1$. Inductors 50 and 52, and capacitors 54 and 56 are tank circuits and increase the bandwidth of hybrid 40.

Hybrid 40 may be simplified by removing the tank circuits made up of inductors 50 and 52 and capacitors 54 and 56. However, this reduces the bandwidth of hybrid 40.

Hybrids 10 and 40 incorporate the broad bandwidths of transmission line ring hybrids, while achieving the small size requirements of MMIC technology. The broad bandwidth results from choosing elements according to the analysis above, while the size requirements are filled by using lumped elements. The objects of the invention are therefore achieved.

Thus there has been provided, in accordance with the present invention, a lumped element ring hybrid that fully satisfies the objects, aims, and advantages set forth above. While the invention has been described in conjunction with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

We claim:

1. A broad bandwidth, lumped element ring hybrid comprising:
    $\pi$ circuit means including first, second, third, and fourth terminals;
    an electrical ground;
    first inductive means coupled between the first terminal and the electrical ground;
    second inductive means coupled between the second terminal and the electrical ground;

first tank circuit means coupled between the third terminal and the electrical ground;

second tank circuit means coupled between the fourth terminal and the electrical ground; and first capacitive means coupled between the first terminal and the second terminal.

2. A lumped element ring hybrid as claimed in claim 1, wherein the $\pi$ circuit means comprises:

third inductive means coupled between the third terminal and the fourth terminal;

second capacitive means coupled between the third terminal and the first terminal; and third capacitive means coupled between the fourth terminal and the second terminal.

3. A lumped element ring hybrid as claimed in claim 1, wherein the first tank circuit comprises:

first tank inductive means; and first tank capacitive means coupled in parallel with the first tank inductive means between the third terminal and the electrical ground.

4. A lumped element ring hybrid as claimed in claim 1, wherein the second tank circuit comprises:

second tank inductive means; and second tank capacitive means coupled in parallel with the second tank inductive means between the fourth terminal and the electrical ground.

* * * * *